(12) United States Patent
Byun et al.

(10) Patent No.: US 11,925,072 B2
(45) Date of Patent: Mar. 5, 2024

(54) DISPLAY APPARATUS INCLUDING ORGANIC INSULATION LAYER DEFINED OPENING

(71) Applicant: Samsung Display Co., Ltd., Yongin-si (KR)

(72) Inventors: Jin-Su Byun, Seoul (KR); Woongsik Kim, Hwaseong-si (KR); Donghwan Bae, Seoul (KR); Sanghyun Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 216 days.

(21) Appl. No.: 17/375,554

(22) Filed: Jul. 14, 2021

(65) Prior Publication Data
US 2022/0190067 A1   Jun. 16, 2022

(30) Foreign Application Priority Data
Dec. 11, 2020   (KR) .................. 10-2020-0173406

(51) Int. Cl.
*H10K 59/12*   (2023.01)
*H10K 50/84*   (2023.01)
(Continued)

(52) U.S. Cl.
CPC ......... *H10K 59/122* (2023.02); *H10K 50/844* (2023.02); *H10K 59/40* (2023.02);
(Continued)

(58) Field of Classification Search
CPC .... H10K 50/844; H10K 50/858; H10K 50/85; H10K 50/856; H10K 50/8426;
(Continued)

(56) References Cited

U.S. PATENT DOCUMENTS

| 10,388,913 B2 | 8/2019 | Jung et al. |
| 10,734,452 B1 | 8/2020 | Kim et al. |

(Continued)

FOREIGN PATENT DOCUMENTS

| CN | 111063706 A | * | 4/2020 | ............. G06F 3/041 |
| EP | 3441858 A1 | * | 2/2019 | ........... G06F 3/0412 |

(Continued)

*Primary Examiner* — Ida M Soward
(74) *Attorney, Agent, or Firm* — KILE PARK REED & HOUTTEMAN PLLC

(57) ABSTRACT

A display apparatus includes a display panel including a first electrode, a pixel defining layer including a first opening that exposes at least a portion of the first electrode, a light emitting layer disposed on the first electrode, a display device layer including a second electrode disposed on the light emitting layer, and a thin-film encapsulation layer that overlaps the display device layer, an input sensing panel disposed on the thin-film encapsulation layer and including a sensing insulation layer and a conductive layer, and an organic insulation layer that overlaps the sensing insulation layer and includes a second opening overlapping the first opening. A side surface of the organic insulation layer defines the second opening and includes protruding side surfaces inclined in different directions from a side surface of the pixel defining layer, and the side surface of the pixel defining layer defines the first opening.

20 Claims, 16 Drawing Sheets

(51) Int. Cl.
  *H10K 50/844* (2023.01)
  *H10K 59/122* (2023.01)
  *H10K 59/40* (2023.01)
  *H10K 50/15* (2023.01)
  *H10K 50/16* (2023.01)
  *H10K 50/17* (2023.01)
  *H10K 50/816* (2023.01)
  *H10K 50/828* (2023.01)
  *H10K 50/842* (2023.01)

(52) U.S. Cl.
  CPC ............. *H10K 50/15* (2023.02); *H10K 50/16* (2023.02); *H10K 50/17* (2023.02); *H10K 50/171* (2023.02); *H10K 50/816* (2023.02); *H10K 50/828* (2023.02); *H10K 50/8426* (2023.02)

(58) Field of Classification Search
  CPC ...... H10K 50/17; H10K 50/171; H10K 50/15; H10K 50/16; H10K 50/816; H10K 50/828; H10K 59/122; H10K 59/40; H10K 59/352; H10K 59/12; H10K 59/124; H10K 2102/00; G06F 3/0412; G06F 3/0446; G06F 2203/04111; G06F 2203/04112

See application file for complete search history.

(56) References Cited

U.S. PATENT DOCUMENTS

| | | | |
|---|---|---|---|
| 2014/0339509 A1 | 11/2014 | Choi et al. | |
| 2015/0060832 A1* | 3/2015 | Ito | H10K 50/856 257/40 |
| 2018/0145280 A1* | 5/2018 | Furuie | H10K 50/844 |
| 2021/0126060 A1* | 4/2021 | Koo | H10K 59/121 |
| 2021/0134906 A1* | 5/2021 | Lee | H10K 59/1213 |
| 2022/0107700 A1* | 4/2022 | Kim | H10K 59/122 |

FOREIGN PATENT DOCUMENTS

| | | | | |
|---|---|---|---|---|
| KR | 10-2019-0062678 | 6/2019 | | |
| KR | 10-2048924 | 11/2019 | | |
| KR | 10-2020-0071190 | 6/2020 | | |
| KR | 10-2020-0089379 | 7/2020 | | |
| KR | 20200101552 A * | 8/2020 | ........... | G06F 3/0412 |
| WO | WO-2020080864 A1 * | 4/2020 | ........... | G06F 3/0443 |

* cited by examiner

DISPLAY APPARATUS INCLUDING ORGANIC INSULATION LAYER DEFINED OPENING

CROSS-REFERENCE TO RELATED APPLICATION(S)

This application claims priority to and benefits of Korean Patent Application No. 10-2020-0173406 under 35 U.S.C. § 119, filed on Dec. 11, 2020 in the Korean Intellectual Property Office, the entire contents of which are herein incorporated by reference.

BACKGROUND

1. Technical Field

The disclosure relates to a display apparatus including an input sensing panel having improved light emitting efficiency.

2. Discussion of the Related Art

A display apparatus may include a display panel for displaying an image and an input sensing panel for detecting an external input. The input sensing panel may be integrated with the display panel through a continuous process. Alternatively, the input sensing panel may be provided through a process separate from the display panel and coupled with the display panel.

SUMMARY

The disclosure provides an input sensing panel that may improve a light emitting efficiency and a display apparatus including the same.

An embodiment provides a display apparatus that may include a display panel including a first electrode, a pixel defining layer including a first opening that exposes at least a portion of the first electrode, a light emitting layer disposed on the first electrode, a display device layer including a second electrode disposed on the light emitting layer, and a thin-film encapsulation layer that overlaps the display device layer, an input sensing panel disposed on the thin-film encapsulation layer and including a sensing insulation layer and a conductive layer, and an organic insulation layer that overlaps the sensing insulation layer and includes a second opening overlapping the first opening. A side surface of the organic insulation layer may define the second opening and include protruding side surfaces inclined in different directions from a side surface of the pixel defining layer, and the side surface of the pixel defining layer may define the first opening.

In an embodiment, an inclined angle of each of the protruding side surfaces at cross points with a virtual line may be in a range from about 20° to about 45°, and the virtual line may extend in a same direction as an extension direction of the side surface of the pixel defining layer.

In an embodiment, the protruding side surfaces may include a first protruding side surface, a second protruding side surface, and a third protruding side surface that may be sequentially connected, the first protruding side surface and the second protruding side surface may be connected in direction away from the side surface of the pixel defining layer, the second protruding side surface and the third protruding side surface may be connected in direction toward the side surface of the pixel defining layer, and inclined angles of the first protruding side surface and the third protruding side surface at cross points with the virtual line may be equal to each other.

In an embodiment, a corner of the side surface of the organic insulation layer may extend in a same direction as a normal line of a corner of the side surface of the pixel defining layer.

In an embodiment, in the side surface of the pixel defining layer, a distance to the side surface of the organic insulation layer defining the second opening may be in a range from about 0.5 μm to about 3 μm.

In an embodiment, an inclined angle of each of the protruding side surfaces from the sensing insulation layer may be in a range from about 45° to about 89°.

In an embodiment, the display apparatus may further include a cover layer disposed on the organic insulation layer overlapping the side surface of the organic insulation layer defining the second opening, wherein the cover layer may have a refractive index greater than a refractive index of the organic insulation layer.

In an embodiment, the cover layer overlapping the second opening may contact the sensing insulation layer.

In an embodiment, the cover layer may include a base layer including a polymer material, and a high refractive material including at least one of zirconium oxide ($ZrO_2$), titanium oxide ($TiO_2$), silicone oxide ($SiO_2$), and zinc oxide ($ZnO_2$), which may be included in the base layer.

In an embodiment, the organic insulation layer may include a base layer including a polymer material, and a low refractive material including at least one of (ethyl)hexyl acrylate, pentafluoropropyl acrylate, poly(ethylene glycol) dimethacrylate, and ethylene glycol dimethacrylate, which may be included in the base layer.

In an embodiment, the first opening may include a plurality of sub openings having different areas, and a number of the protruding side surfaces surrounding one of the plurality of sub openings may be different from a number of the protruding side surfaces surrounding another one of the plurality of sub openings.

In an embodiment, the first opening may have at least one of a circular shape and an oval shape in plan view.

In an embodiment, at least one of the protruding side surfaces may include a curved surface.

In an embodiment, the second opening may have an area greater than an area of the first opening.

In an embodiment, a display apparatus may include a display panel including a first electrode, a pixel defining layer including a first opening that exposes at least a portion of the first electrode, a light emitting layer disposed on the first electrode, a display device layer including a second electrode disposed on the light emitting layer, and a thin-film encapsulation layer that overlaps the display device layer, an input sensing panel disposed on the thin-film encapsulation layer and including a sensing insulation layer and a conductive layer, and an organic insulation layer that overlaps the sensing insulation layer and includes a second opening overlapping the first opening. A side surface of the organic insulation layer may define the second opening and include a first protruding side surface, a second protruding side surface, and a third protruding side surface that are inclined in at least two different directions in plan view, the first protruding side surface and the second protruding side surface may be connected in a direction away from a side surface of the pixel defining layer, which defines the first opening, and the second protruding side surface and the third protruding side surface may be connected in a direction toward the side surface of the pixel defining layer.

In an embodiment, an inclined angle of each of the protruding side surfaces at cross points with a virtual line may be in a range from about 20° to about 45°, and the virtual line extends in a same direction as an extension direction of the side surface of the pixel defining layer.

In an embodiment, inclined angles of the first and third protruding side surfaces at cross points with the virtual line may be equal to each other.

In an embodiment, a corner of the side surface of the organic insulation layer may extend in a same direction as a normal line of a corner of the side surface of the pixel defining layer.

In an embodiment, in the side surface of the pixel defining layer, a distance to the side surface of the organic insulation layer defining the second opening may be in a range from about 0.5 μm to about 3 μm.

In an embodiment, the display apparatus may further include a cover layer disposed on the organic insulation layer overlapping the side surface of the organic insulation layer defining the second opening, wherein the cover layer may have a refractive index greater than a refractive index of the organic insulation layer.

BRIEF DESCRIPTION OF THE FIGURES

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
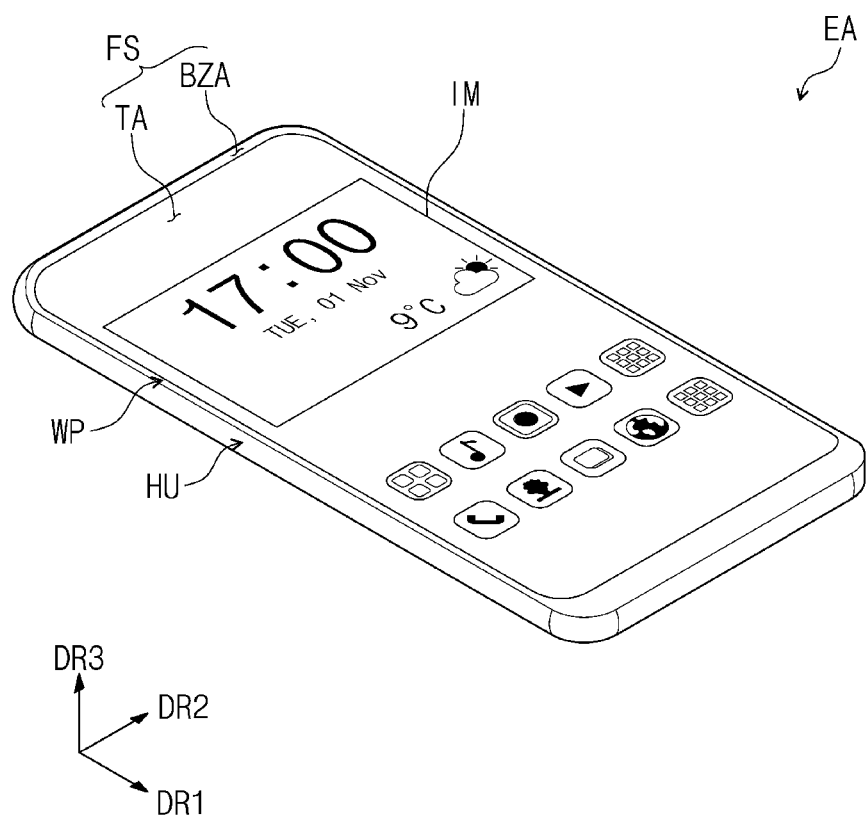
FIG. 1 is a schematic perspective view of a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this application, it will be understood that when a component (or region, layer, portion) is referred to as being 'on', 'connected to', or 'coupled to' another component, it can be directly disposed/connected/coupled on/to the component, or an intervening third component may also be present.

Like reference numerals refer to like elements throughout. In the figures, the thickness, ratio, and dimensions of components may be exaggerated for clarity of illustration.

The term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although terms such as "first" and "second" are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms (and vice versa) unless specified to the contrary.

"Under", "below", "above", "upper", and the like are used for explaining relative association of components illustrated in the drawings. The terms may be a relative concept and described based on directions expressed in the drawings.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or to "not overlap" another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terms "include", "have", "comprise", and the like specify a property, a fixed number, a step, an operation, an element, a component or a combination thereof, but do not exclude other properties, fixed numbers, steps, operations, elements, components or combinations thereof.

Figure 2:
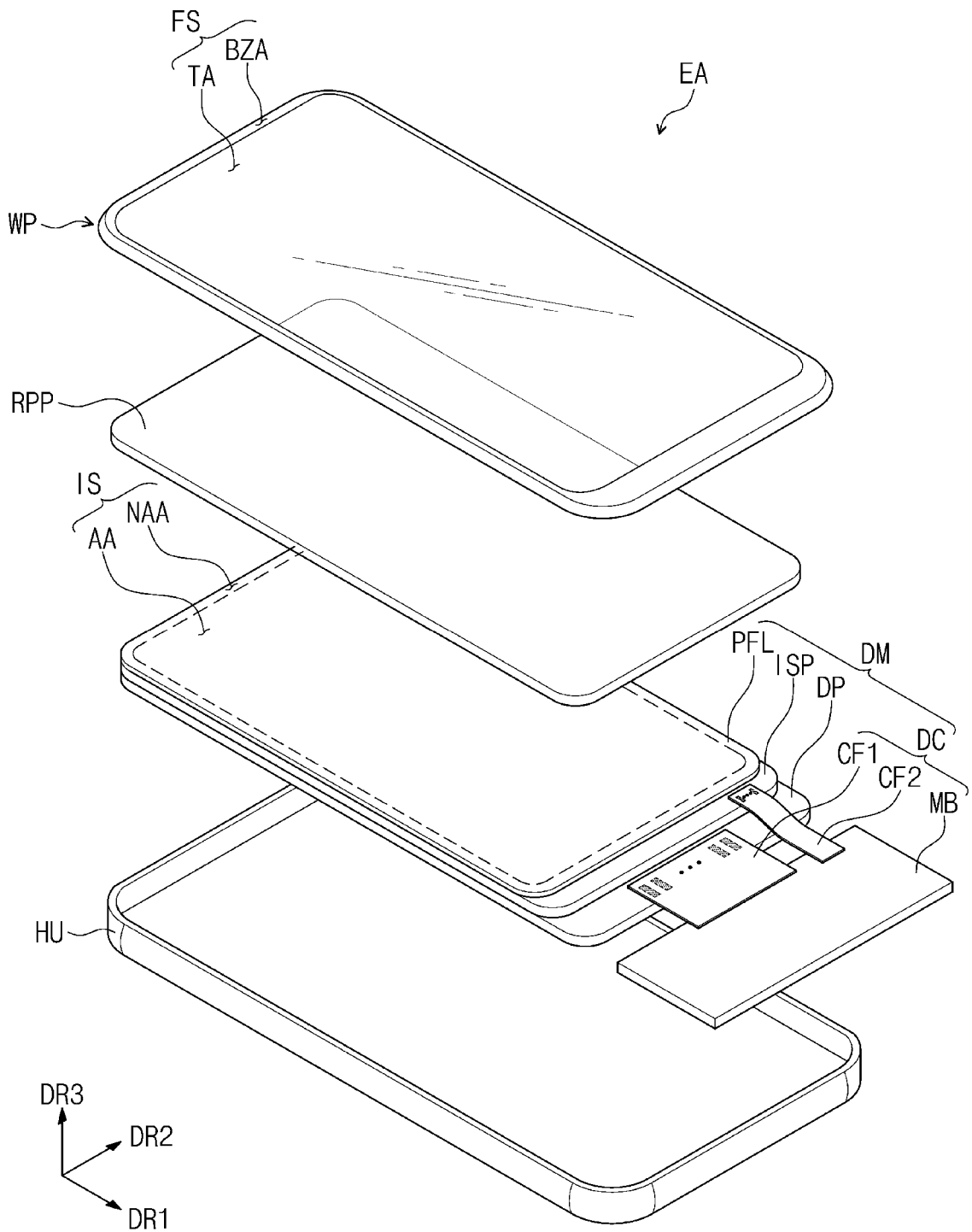
FIG. 2 is an exploded schematic perspective view of the display apparatus according to an embodiment.
Figure 3:
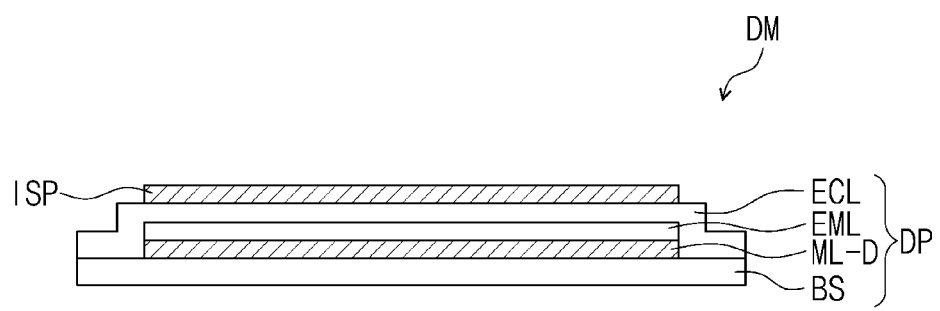
FIG. 3 is a schematic cross-sectional view of a display module according to an embodiment.
Figure 3:
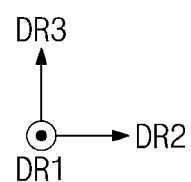

FIG. 1 is a schematic perspective view of a display apparatus according to an embodiment. FIG. 2 is an exploded schematic perspective view of the display apparatus according to an embodiment. FIG. 3 is a schematic cross-sectional view of a display module according to an embodiment.

Referring to FIGS. 1 and 2, a display apparatus EA may be activated by an electrical signal. The display apparatus EA may take the form of various embodiments. For example, the display apparatus EA may be used for large-sized display apparatuses such as televisions, monitors, or outdoor advertisement boards, and small and medium-sized display apparatuses such as personal computers, notebook computers, personal digital terminals, navigation units for vehicles, game consoles, portable electronic devices, and cameras. The above-described devices are merely examples, and thus the display apparatus may be adopted to other display apparatuses. In a few embodiments described herein, a smartphone is illustrated as an example.

The display apparatus EA may display an image IM in a third direction DR3 on a display surface FS parallel to each of a first direction DR1 and a second direction DR2. The image IM may include a static image and/or a dynamic image. In FIG. 1, a clock window and icons are illustrated as an example of the image IM. The display surface FS, on which the image IM may be displayed, may correspond to each of a front surface of the display apparatus EA and a front surface of a window panel WP.

In an embodiment, a front surface (or a top surface) and a rear surface (or a bottom surface) of each of members may be defined based on a direction in which the image IM may be displayed. The front surface and the rear surface may be opposite to each other in the third direction DR3, and a normal direction of each of the front surface and the rear surface may be parallel to the third direction DR3. Here, directions indicated by the first to third directions DR1, DR2 and DR3, as relative concepts, may be converted with respect to each other.

The display apparatus EA may include a window panel WP, an anti-reflection panel RPP, a display module DM, and a housing HU. In an embodiment, the window panel WP and the housing HU may be connected (e.g., coupled) to constitute an appearance of the display apparatus EA.

The window panel WP may include an optically clear insulating material. For example, the window panel WP may include glass or plastic. The window panel WP may have a multi-layer structure or a single-layer structure. For example, the window panel WP may include plastic films connected (e.g., coupled) by an adhesive or a glass substrate and a plastic film, which may be connected (e.g., coupled) by an adhesive.

As described above, the front surface of the window panel WP may define the display surface FS of the display apparatus EA. The transmission area TA may be an optically clear area. For example, the transmission area TA may have a visible light transmittance of about 90% or more.

The bezel area BZA may has a relatively lower light transmittance than that of the transmission area TA. The bezel area BZA may define a shape of the transmission area TA. The bezel area BZA may be disposed adjacent to the transmission area TA and may surround the transmission area TA.

The bezel area BZA may have a predetermined color. The bezel area BZA may cover a peripheral area NAA of the display module DM to block the peripheral area NAA from being viewed from the outside. However, this is merely an example. For example, the bezel area BZA may be omitted in the window panel WP according to an embodiment.

The anti-reflection panel RPP may be disposed below the window panel WP. The anti-reflection panel RPP may reduce a reflectance of external light incident from above the window panel WP. The anti-reflection panel RPP according to an embodiment may be omitted or included in the display module DM.

The display module DM may display the image IM and sense an external input. The display module DM may include a front surface including an active area AA and a peripheral area NAA. The active area AA may be activated by an electric signal.

In an embodiment, the active area AA may be an area on which the image IM may be displayed and by which an external input may be sensed, e.g., at the same time. The transmission area TA may overlap at least a portion of the active area AA. For example, the transmission area TA may overlap an entire surface or at least a portion of the active area AA.

Thus, a user may view the image IM through the transmission area TA or provide an external input. However, this is merely an example. For example, in the display module DM according to an embodiment, the active area AA may be separated into an area on which the image IM may be displayed and an area by which an external input may be sensed. However, embodiments are not limited thereto.

The peripheral area NAA may be covered by the bezel area BZA. The peripheral area NAA may be disposed adjacent to the active area AA. The peripheral area NAA may surround the active area AA. A driving circuit or a driving line for driving the active area AA may be disposed in the peripheral area NAA.

The display module DM may include a display panel DP, an input sensing panel ISP, an optical functional layer PFL, and a driving circuit DC. The optical functional layer PFL may include an organic insulation layer OFL and a cover layer HRF, which will be described later. A description on the optical functional layer PFL will be described with reference to FIGS. 7A to 7B.

The display panel DP may be a component that substantially generates the image IM. The image IM generated by the display panel DP may be viewed from outside through the transmission area TA.

The input sensing panel ISP may provide an external input applied from outside. As described above, the input sensing panel ISP may sense an external input provided to the window panel WP.

The external input may include various types of inputs provided from outside of the display apparatus EA. The external input applied from outside may be provided in various types. For example, the external input may include contact that may be generated by a portion of a user's body such as hands and an external input (e.g., hovering) that may be applied by being adjacent to the display apparatus EA or being disposed adjacent by a predetermined distance. The external input may have various types such as force, pressure, and light. However, embodiments are not limited thereto.

The driving circuit DC may be electrically connected to the display panel DP and the input sensing panel ISP. The driving circuit DC may include a main circuit board MB, a first circuit board CF1, and a second circuit board CF2.

The first circuit board CF1 may be electrically connected to the display panel DP. The first circuit board CF1 may connect the display panel DP and the main circuit board MB. In an embodiment, the first circuit board CF1 is illustrated as a flexible circuit film. However, this is merely an example. The first circuit board CF1 according to an embodiment may not be connected to the main circuit board MB. The first circuit board CF1 may be a rigid substrate.

The first circuit board CF1 may be connected to pads (display pads) of the display panel DP, which may be disposed on the peripheral area NAA. The first circuit board CF1 may provide an electrical signal for driving the display panel DP to the display panel DP. The electrical signal may be generated from the first circuit board CF1 or the main circuit board MB.

The second circuit board CF2 may be electrically connected to the input sensing panel ISP. The second circuit board CF2 may connect the input sensing panel ISP and the main circuit board MB. In an embodiment, the second circuit board CF2 is illustrated as a flexible circuit film. However, this is merely an example. The second circuit board CF2 according to an embodiment may not be connected to the main circuit board MB. The first circuit board CF1 may be a rigid substrate.

The second circuit board CF2 may be connected to pads (sensing pads) of the input sensing panel ISP, which may be disposed on the peripheral area NAA. The second circuit board CF2 may provide an electrical signal for driving the input sensing panel ISP to the input sensing panel ISP. The electrical signal may be generated from the second circuit board CF2 or the main circuit board MB.

The main circuit board MB may include all sorts of driving circuits for driving the display module DM or a connector for power supply. Each of the first circuit board CF1 and the second circuit board CF2 may be connected to the main circuit board MB.

The display module DM according to an embodiment may be controlled through a main circuit board MB. However, this is merely an example. In the display module DM according to an embodiment, the display panel DP and the input sensing panel ISP may be connected to different main circuit boards, and one of the first circuit board CF1 and the second circuit board CF2 may not be connected to the main circuit board MB. However, embodiments are not limited thereto.

The housing HU may be connected (e.g., coupled) with the window panel WP. The housing HU may be coupled with the window panel WP to provide a predetermined inner space. The display module DM may be accommodated in the inner space.

The housing HU may include a material having a relatively high rigidity. For example, the housing HU may include frames and/or plates, which may be made of glass, plastic, or metal or a combination thereof. The housing HU may stably protect components of the display apparatus EA accommodated in the inner space from an external impact.

Referring to FIG. 3, the display panel DP may include a base substrate BS, a circuit device layer ML-D, a display device layer EML, and a thin-film encapsulation layer ECL.

The base substrate BS may be a base layer on which the circuit device layer ML-D, the display device layer EML, the thin-film encapsulation layer ECL, and the input sensing panel ISP may be laminated. The base substrate BS may be flexible or rigid and have a single-layer structure or a multi-layer structure. However, embodiments are not limited thereto.

The circuit device layer ML-D may be disposed on the base substrate BS. The circuit device layer ML-D may include insulation layers, conductive layers, and a semiconductor layer. The conductive layers of the circuit device layer ML-D may constitute signal lines or a control circuit of a pixel.

The display device layer EML may be disposed on the circuit device layer ML-D. The display device layer EML may include organic light emitting diodes. However, this is merely an example. The display device layer EML according to an embodiment may include inorganic light emitting diodes, organic-inorganic light emitting diodes, or a liquid crystal layer.

The thin-film encapsulation layer ECL may include an organic layer and inorganic layers sealing the organic layer. The thin-film encapsulation layer ECL may seal the display device layer EML to block moisture and oxygen introduced to the display device layer EML.

The inorganic layers may prevent external moisture or oxygen from being permeated into the display device layer EML. The inorganic layers may contain silicon nitride, silicon oxide, or a compound thereof. The inorganic layers may be provided through a deposition process.

An organic layer may be disposed on the display device layer EML to provide a flat surface. As curved portions or particles provided on a top surface of the display device layer EML may be covered by the organic layer, components provided on the organic layer, e.g., the input sensing panel ISP, may not be affected.

The input sensing panel ISP may be disposed on the thin-film encapsulation layer ECL. The input sensing panel ISP may be disposed directly on the thin-film encapsulation layer ECL and provided with the thin-film encapsulation layer ECL through a continuous process. The input sensing panel ISP may sense an external input by one of a self-capacitance type method or a mutual capacitance type method. Sensing patterns contained in the input sensing panel ISP may be variously formed, and arranged and connected appropriately to the method.

Figure 4A:
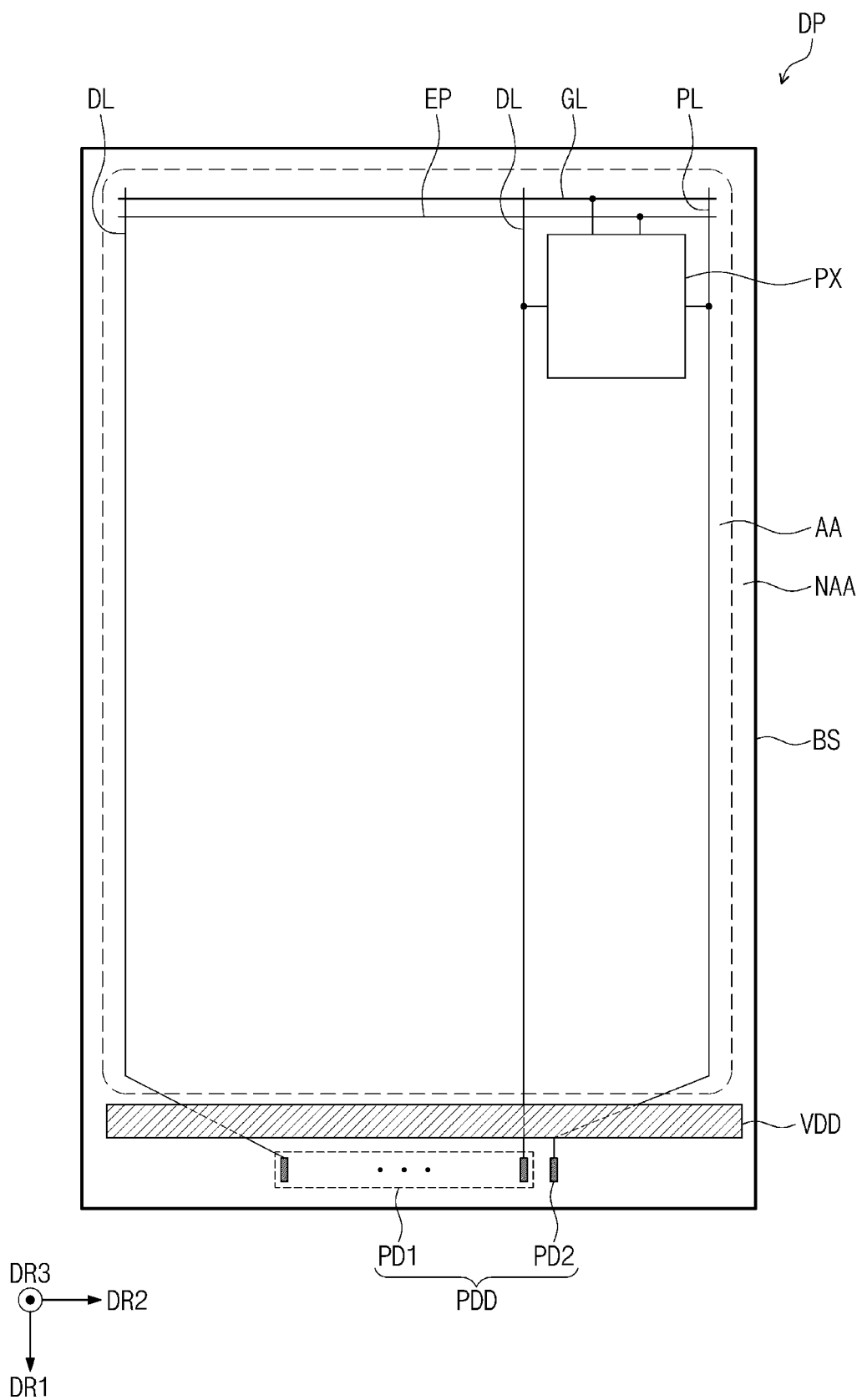
FIG. 4A is a schematic plan view illustrating the display panel according to an embodiment.
Figure 4B:
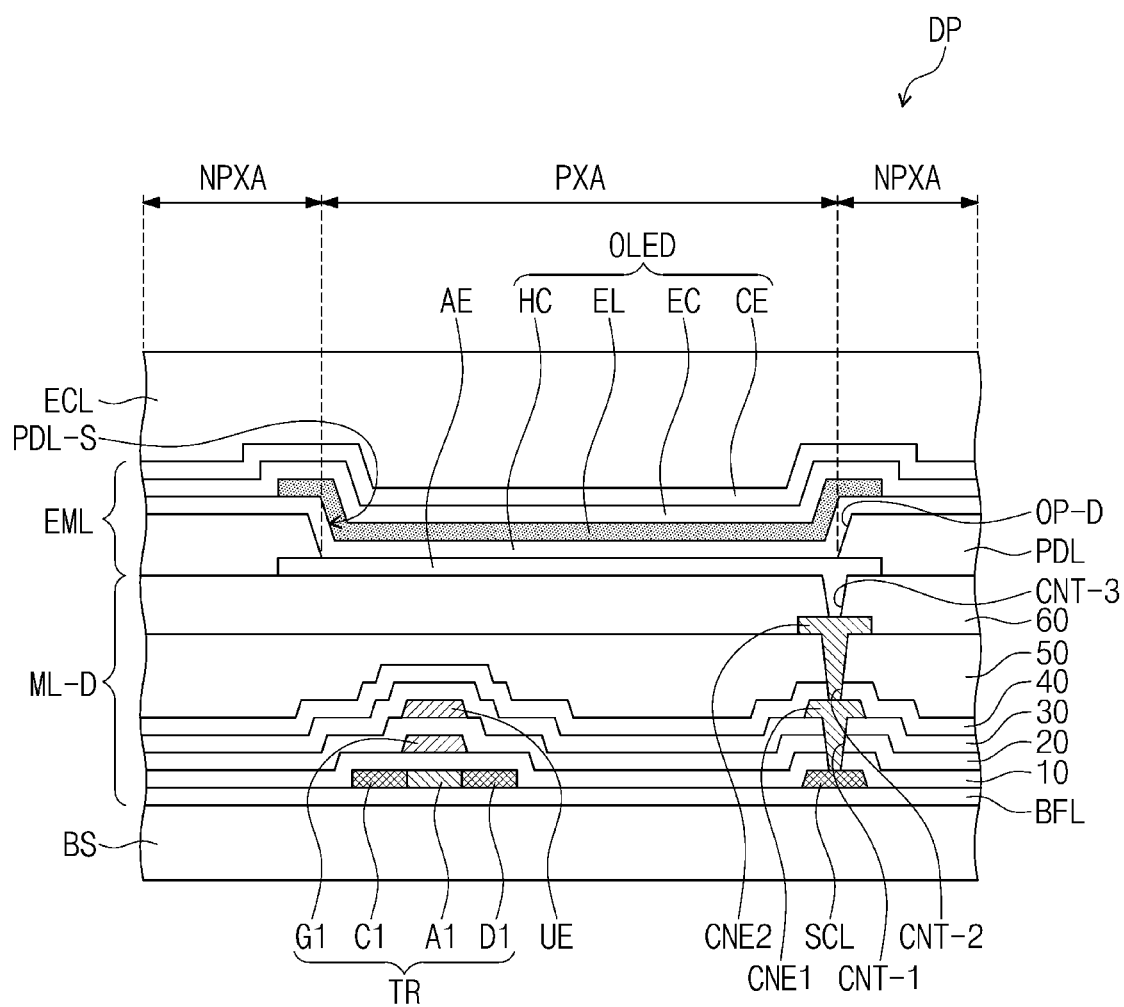
FIG. 4B is a schematic cross-sectional view illustrating the display panel according to an embodiment.
Figure 4C:
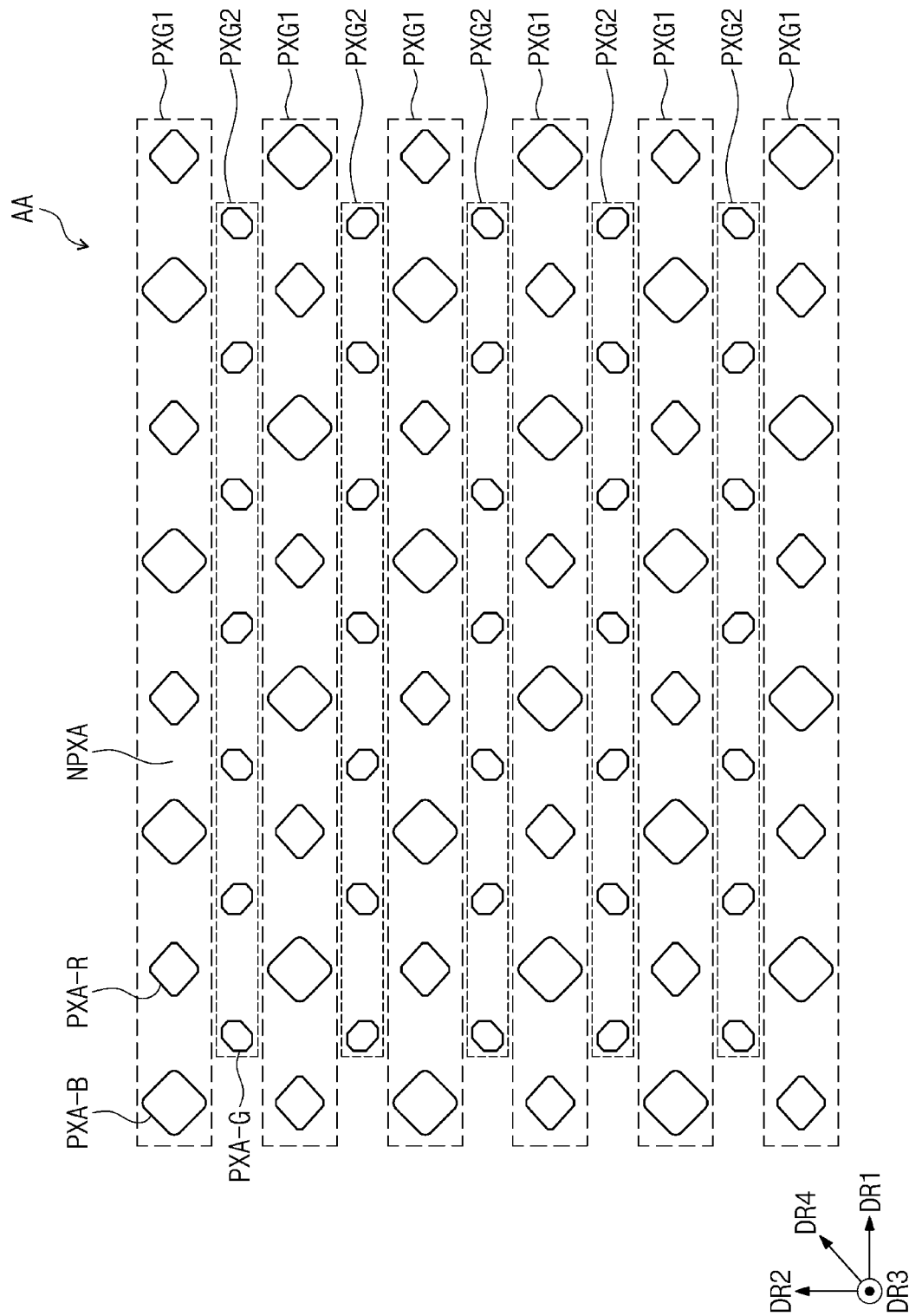
FIG. 4C is a schematic plan view illustrating light emitting areas according to an embodiment.

FIG. 4A is a schematic plan view illustrating the display panel according to an embodiment. FIG. 4B is a schematic cross-sectional view illustrating the display panel according to an embodiment. FIG. 4C is a schematic plan view illustrating light emitting areas according to an embodiment.

Referring to FIG. 4A, the display panel DP may be divided into an active area AA and a peripheral area NAA. The active area AA of the display panel DP may be an area on which an image may be displayed, and the peripheral area NAA may be an area on which a driving circuit or a driving line may be disposed. On the active area AA, light emitting devices of each of multiple pixels may be disposed. The active area AA may overlap at least a portion of the transmission area TA, and the peripheral area NAA may be covered by the bezel area BZA.

Signal lines GL, DL, PL, and EP may be connected to pixels PX and transmit an electrical signal to the pixels PX. A scan line GL, a data line DL, a power line PL, and an emission control line EP among the signal lines contained in the display panel DP are illustrated. However, this is merely an example. The signal lines GL, DL, PL, and EP according to an embodiment may further include an initialization voltage line. However, embodiments are not limited thereto.

A power pattern VDD may be disposed on the peripheral area NAA. The power pattern VDD may be connected with power lines PL. Thus, the display panel DP may provide the same first power signal to the pixels by including the power pattern VDD.

The display pads PDD may be disposed on the peripheral area NAA. The display pads PDD may include a first pad PD1 and a second pad PD2. The first pad PD1 may be provided in plurality, and the first pads PD1 may be connected to the data lines DL, respectively. The second pad PD2 may be connected to the power pattern VDD and electrically connected to the power line PL.

The display panel DP may be connected to a flexible circuit board through the display pads PDD and provide electrical signals provided from the main circuit board MB to the pixels PX. Although the display pads PDD may further include pads for receiving other electrical signals in addition to the first pad PD1 and the second pad PD2, embodiments are not limited thereto.

The display panel DP may include insulation layers, a semiconductor pattern, a conductive pattern, and a signal line. The insulation layer, the semiconductor layer, and the conductive layer may be provided by a method such as coating and deposition. Thereafter, the insulation layer, the semiconductor layer, and the conductive layer may be selectively patterned by a photolithography method. By using the above-described method, the semiconductor pattern, the conductive pattern, and the signal line, which may be contained in the circuit device layer ML-D and the display device layer EML, may be provided.

At least one inorganic layer may be provided on a top surface of the base substrate BS. The buffer layer BFL may enhance a coupling force between the base substrate BS and the semiconductor pattern. The buffer layer BFL may include a silicon oxide layer and a silicon nitride layer. The silicon oxide layer and the silicon nitride layer may be alternately laminated with each other.

The semiconductor pattern may be disposed on the buffer layer BFL. The semiconductor pattern may include polysilicon. However, embodiments are not limited thereto. For example, the semiconductor pattern may include amorphous silicon or metal oxide.

FIG. 4B merely illustrates a portion of the semiconductor pattern. The semiconductor pattern may be further disposed on light emitting areas PXA in plan view. The semiconductor pattern may be arranged over the light emitting areas PXA based on a particular rule. The semiconductor pattern has an electrical property that may be different according to whether doped or not. The semiconductor pattern may include a doped area and a non-doped area. The doped area may be doped with a n-type dopant or a p-type dopant. A p-type transistor includes a doped area that may be doped with the p-type dopant.

The doped area may have a conductivity greater than that of the non-doped area and may substantially serve as an electrode or a signal line. The non-doped area may substantially correspond to an active (or a channel) of the transistor. In other words, one portion of the semiconductor pattern may be the active of the transistor, another portion may be a source or a drain of the transistor, and another portion may be a connection electrode or a connection signal line.

As illustrated in FIG. 4B, a source C1, an active A1, and a drain D1 of the transistor TR may be provided from the semiconductor pattern. FIG. 4B illustrates a portion of a connection signal line SCL provided from the semiconductor pattern. Although not separately shown, the connection signal line SCL may be connected to the drain D1 of the transistor TR.

A first insulation layer 10 to a sixth insulation layer 60 may be disposed on the buffer layer BFL. Each of the first insulation layer 10 to the sixth insulation layer 60 may be an inorganic layer or an organic layer. A gate G1 may be disposed on the first insulation layer 10. An upper electrode UE may be disposed on the second insulation layer 20. A first connection electrode CNE1 may be disposed on the third insulation layer 30.

The first connection electrode CNE1 may be connected to the connection signal line SCL through a contact hole CNT-1 passing through the first to third insulation layers 10 to 30. A second connection electrode CNE2 may be disposed on the fifth insulation layer 50. The second connection electrode CNE2 may be connected to the first connection electrode CNE1 through a contact hole CNT-2 passing through the fourth insulation layer 40 and the fifth insulation layer 50.

A light emitting device OLED may be disposed on the sixth insulation layer 60. A first electrode AE may be disposed on the sixth insulation layer 60. The first electrode AE may be connected to the second connection electrode CNE2 through a contact hole CNT-3 passing through the sixth insulation layer 60. A first opening OP-D may be defined in a pixel defining layer PDL.

The first opening OP-D may be defined as a side surface PDL-S of a passing-through portion of the pixel defining layer PDL. At least a portion of the first electrode AE may be exposed from the pixel defining layer PDL by the first opening OP-D.

FIG. 4B illustrates a light emitting area PXA and a non-light emitting area NPXA disposed adjacent to the light emitting area PXA. The light emitting area PXA may be defined by an area of the first opening OP-D.

A hole control layer HC may be disposed on the light emitting area PA and the non-light emitting area NPXA in common. The hole control layer HC may include a hole transport layer and further include a hole injection layer. A light emitting layer EL may be disposed on the hole control layer HC. The light emitting layer EL may be disposed in an area corresponding to the first opening OP-D. For example, the light emitting layer EL may be separately provided in each of the light emitting areas PXA.

An electron control layer EC may be disposed on the light emitting layer EL. The electron control layer EC may include an electron transport layer and further include an electron injection layer. A second electrode CE may be disposed on the electron control layer EC.

A thin-film encapsulation layer ECL may be disposed on the second electrode CE. The thin-film encapsulation layer ECL may correspond to the thin-film encapsulation layer ECL described in FIG. 3.

According to an embodiment, light provided from the light emitting layer EL may transmit components disposed on the light emitting layer EL to generate an optical loss. Thus, the light emitting area PXA defined by the area of the first opening OP-D of the pixel defining layer PDL may be substantially different from a light emitting area provided to the user.

Referring to FIG. 4C, light emitting areas PXA-R, PXA-G, and PXA-B and a non-light emitting area NPXA of the pixels PX may be disposed in the active area AA according to an embodiment. The light emitting areas PXA-R, PXA-G, and PXA-B may be defined as the first opening OP-D defined in the pixel defining layer PDL and may be provided in plurality with different areas.

According to an embodiment, the light emitting areas PXA-R, PXA-G, and PXA-B may include different light emitting areas to provide light having different colors. For example, the first light emitting area PXA-R may provide red light, the second light emitting area PXA-G may provide green light, and the third light emitting area PXA-B may provide blue light.

According to an embodiment, the third light emitting area PXA-B may have a largest area, and the second light emitting area PXA-G may have a smallest area.

Referring to FIG. 4C, the third light emitting areas PXA-B and the first light emitting areas PXA-R may be alternately arranged in the first direction DR1 to constitute a first group PXG1. The second light emitting areas PXA-G may be arranged in the first direction DR1 to constitute a second group PXG2.

The first group PXG1 and the second group PXG2 may be spaced apart from each other in the second direction DR2. Each of the first group PXG1 and the second group PXG2 may be provided in plurality. The first groups PXG1 and the second groups PXG2 may be alternately arranged in the second direction DR2.

A second light emitting area PXA-G may be spaced apart in a fourth direction DR4 from a third light emitting area PXA-B or a first light emitting area PXA-R. The fourth direction DR4 may be a direction between the first direction DR1 and the second direction DR2.

An arrangement structure of the light emitting areas PXA-R, PXA-G, and PXA-B in FIG. 4C may be referred to as a PenTile® structure. However, embodiments are not limited to the arrangement structure of the light emitting areas PXA-R, PXA-G, and PXA-B in FIG. 4C. For example, in an embodiment, the light emitting areas PXA-R, PXA-G, and PXA-B may have a stripe structure in which the third light emitting area PXA-B, the second light emitting area PXA-G, and the first light emitting area PXA-R may be sequentially and alternately arranged. However, embodiments are not limited thereto.

Figure 5:
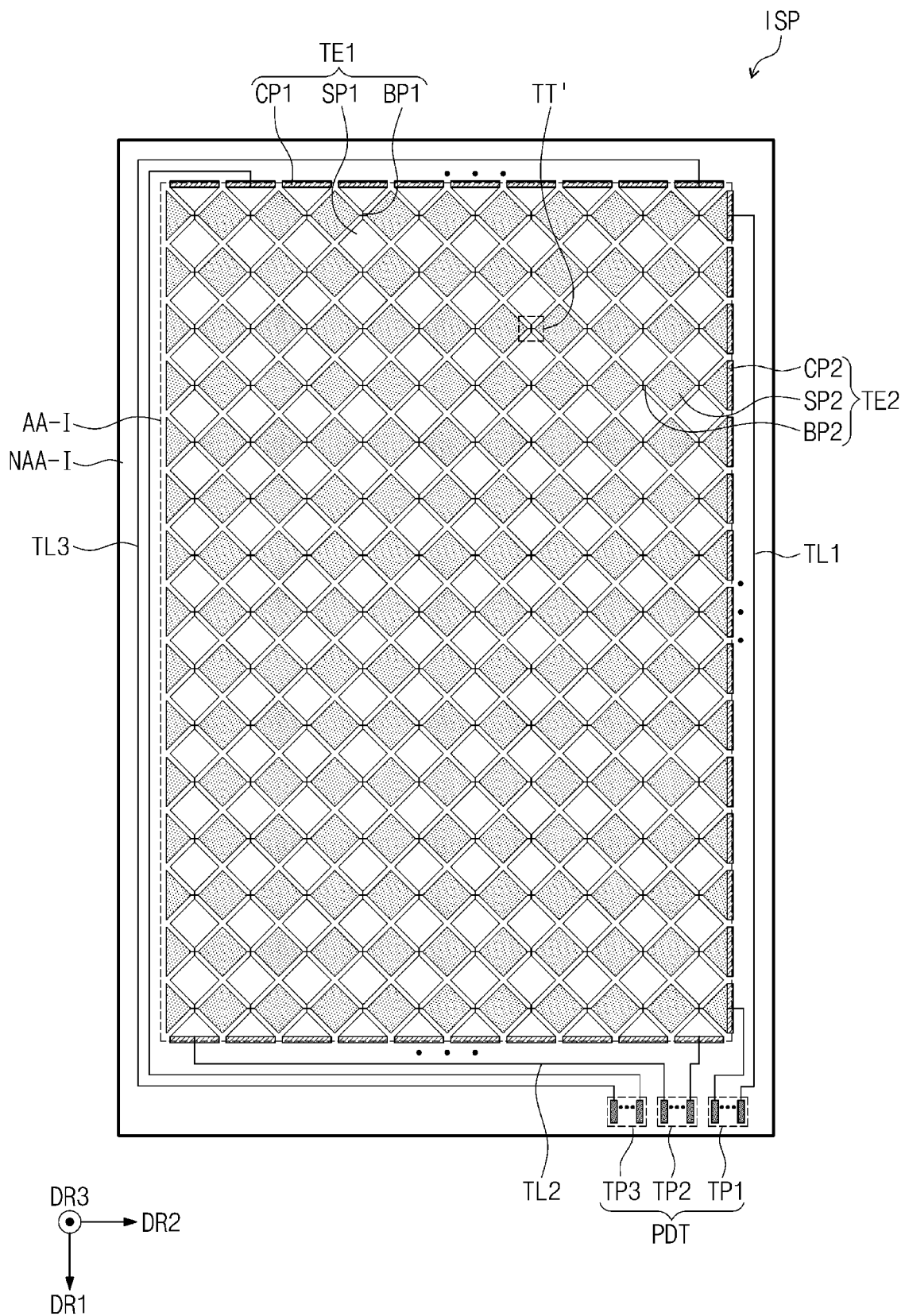
FIG. 5 is a schematic plan view illustrating an input sensing panel according to an embodiment.
Figure 6:
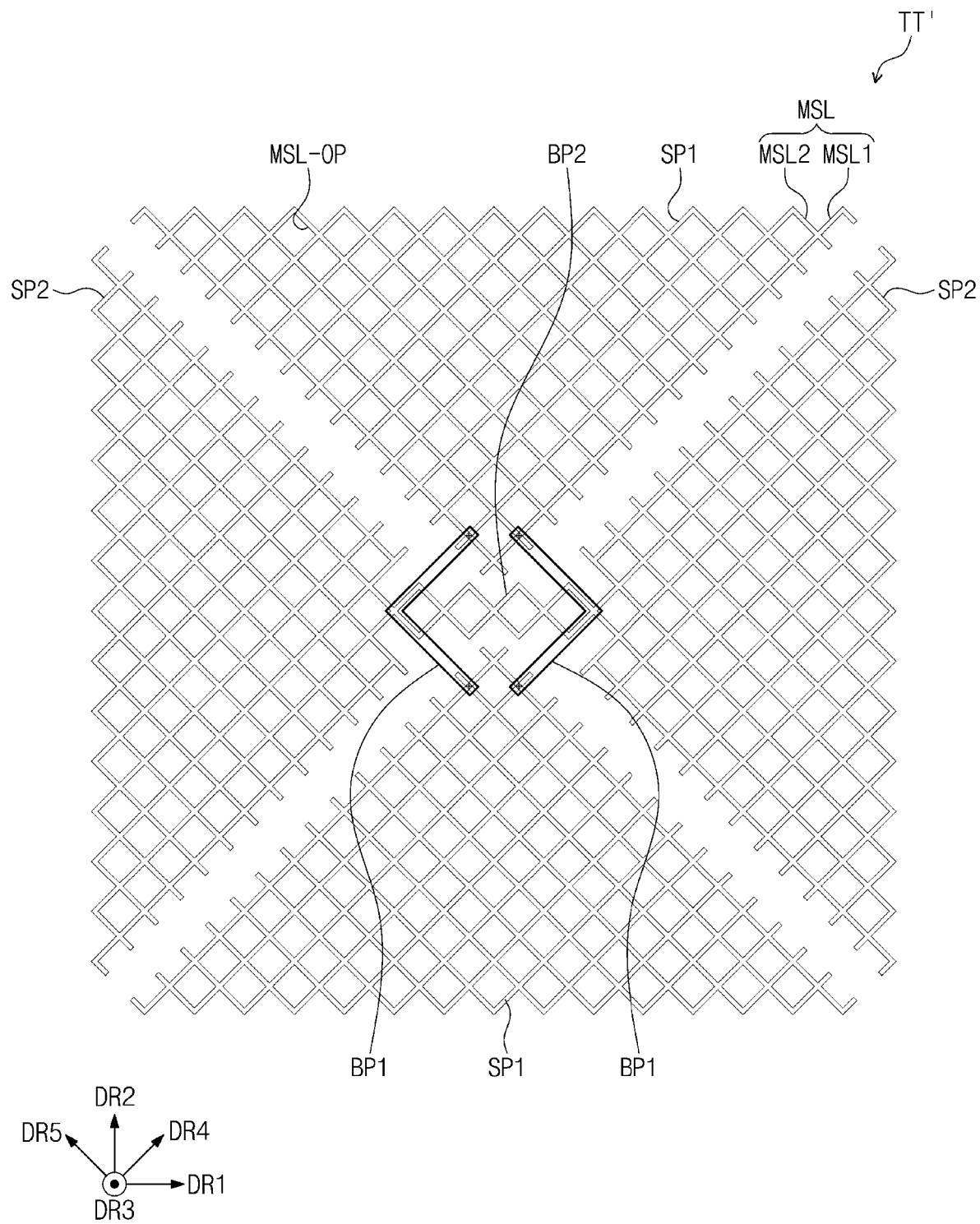
FIG. 6 is an enlarged schematic plan view illustrating area TT' in FIG. 5.
Figure 7A:
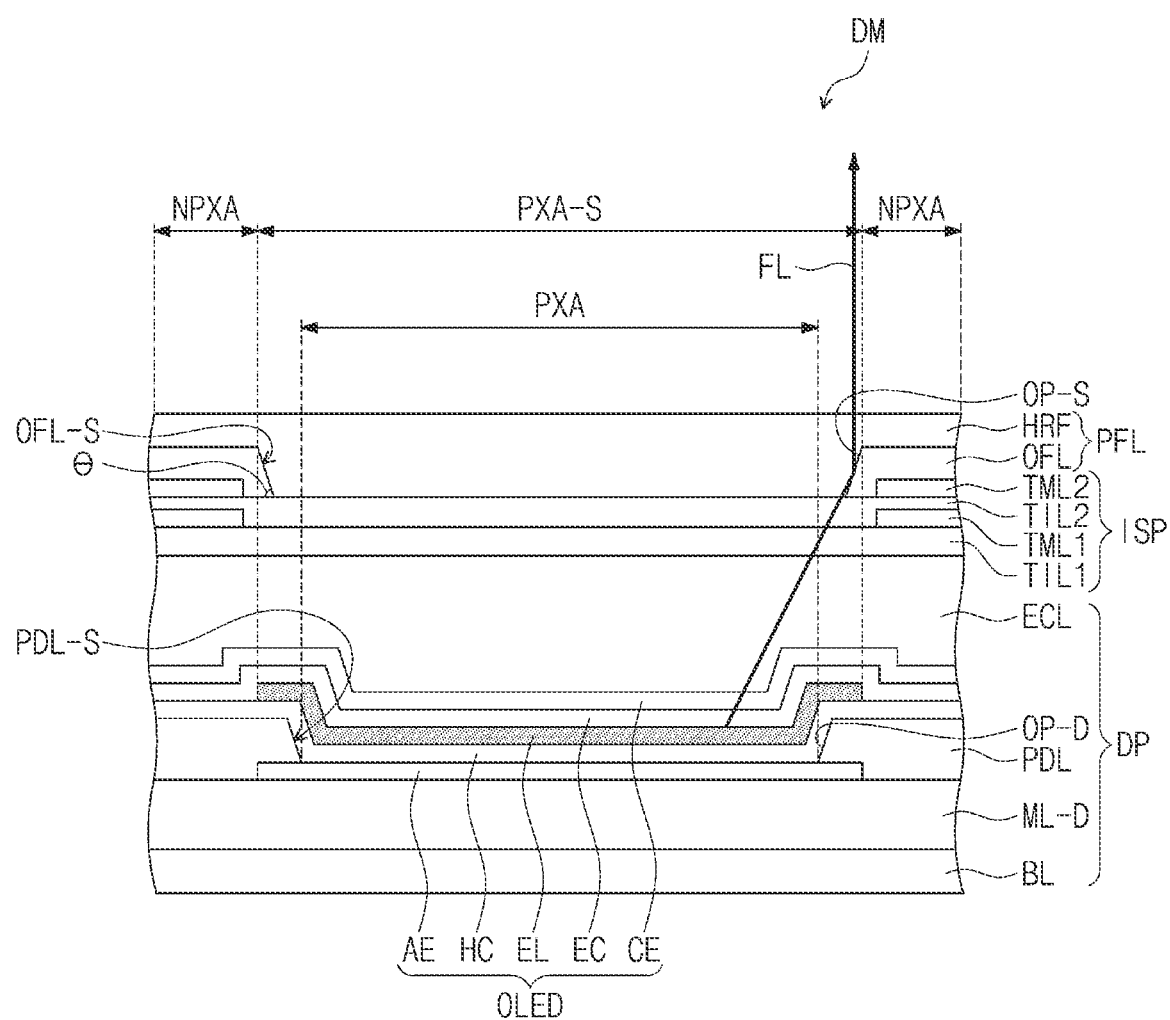
FIG. 7A is a schematic cross-sectional view illustrating a display module according to an embodiment.
Figure 7B:
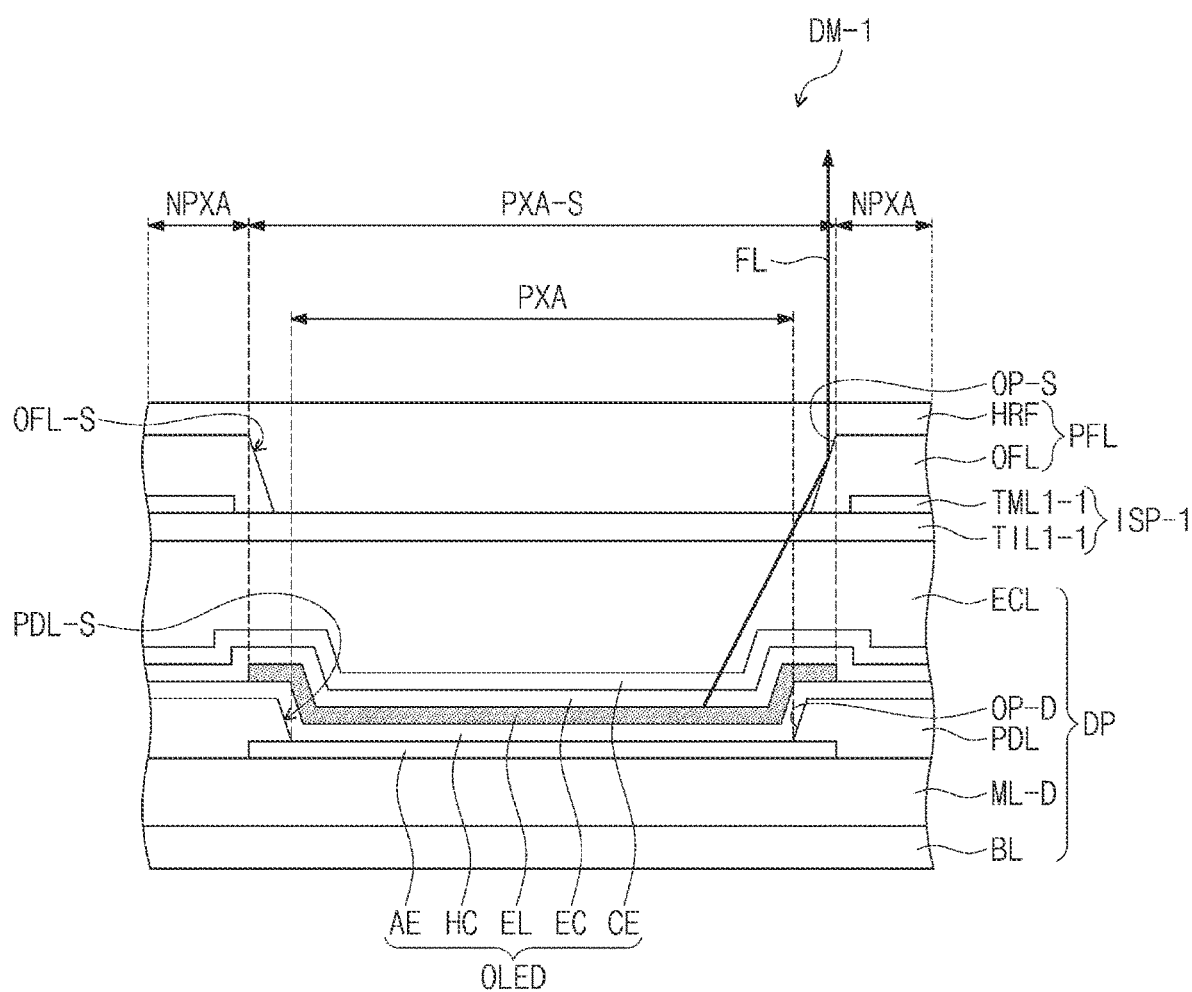
FIG. 7B is a schematic cross-sectional view illustrating a display module according to an embodiment.

FIG. 5 is a schematic plan view illustrating the input sensing panel according to an embodiment. FIG. 6 is an enlarged schematic plan view illustrating area TT' in FIG. 5. FIG. 7A is a schematic cross-sectional view illustrating the display module according to an embodiment. FIG. 7B is a schematic cross-sectional view illustrating a display module according to an embodiment.

The input sensing panel ISP may include sensing electrodes TE1 and TE2, sensing lines TL1, TL2, and TL3, and sensing pads PDT.

The input sensing panel ISP may be divided into an active area AA-I and a peripheral area NAA-I disposed adjacent to the active area AA-I. The active area AA-I and the peripheral area NAA-I of the input sensing panel ISP may correspond to the active area AA and the peripheral area NAA of the display panel DP.

The sensing electrodes TE1 and TE2 may include a first sensing electrode TE1 and a second sensing electrode TE2.

First sensing electrodes TE1 may each extend in the first direction DR1 and be arranged in the second direction DR2. The first sensing electrodes TE1 may include first sensing patterns SP1 and first bridge patterns BP1. The first sensing patterns SP1 may be arranged in the first direction DR1. At least one first bridge pattern BP1 may be connected to two adjacent first sensing patterns SP1

Second sensing electrodes TE2 may each extend in the second direction DR2 and be arranged in the first direction DR1. The second sensing electrodes TE2 may include second sensing patterns SP2 and second bridge patterns BP2. The second sensing patterns SP2 may be arranged in the second direction DR2. At least one second bridge pattern BP2 may extend from two adjacent second sensing patterns SP2.

The sensing lines TL1, TL2, and TL3 may include a first sensing line TL1, a second sensing line TL2, and a third sensing line TL3.

The first sensing line TL1 may be connected to an end of the second sensing electrode TE2. A second junction part CP2 may be disposed at an end of the second sensing electrode TE2 connected with the first sensing line TL1.

The second sensing line TL2 may be connected to an end of the first sensing electrode TE1. The third sensing line TL3 may be connected to another end of the first sensing electrode TE1, which may be opposite to the end of the first sensing electrode TE1. A first junction part CP1 may be disposed at each of the end of the first sensing electrode TE1 connected with the second sensing line TL2 and another end of the first sensing electrode TE1 connected with the third sensing line TL3.

The first sensing electrode TE1 according to an embodiment may be connected to the second sensing line TL2 and the third sensing line TL3. Thus, sensitivity based on an area with respect to the first sensing electrode TE1 having a relatively greater length than the second sensing electrode TE2 may be uniformly maintained.

The sensing pads PDT may be disposed on the peripheral area NAA. The sensing pads PDT may include a first sensing pad TP1, a second sensing pad TP2, and a third sensing pad TP3. The first sensing pad TP1 may be connected to the first sensing line TL1 and electrically connected to the second sensing electrode TE2. The second sensing pad TP2 may be connected to the second sensing line TL2. The third sensing pad TP3 may be connected to the third sensing line TL3. Thus, the second sensing pad TP2 and the third sensing pad TP3 may be electrically connected with the first sensing electrode TE1.

However, embodiments are not limited thereto. The sensing pads PDT of the input sensing panel ISP may be disposed on the same layer as the display pads of the display panel DP through the contact holes defined in the sensing insulation layers, and may not be limited to any one embodiment.

Referring to FIG. 6, the input sensing panel ISP according to an embodiment may include a mesh line MSL extending in the fourth direction DR4 and a fifth direction DR5. The mesh line MSL may include a first mesh line MSL1 extending in the fourth direction DR4 and a second mesh line MSL2 extending in the fifth direction DR5.

The mesh lines MSL1 and MSL2 may not overlap the light emitting areas PXA-R, PXA-G, and PXA-B (refer to FIG. 4C), and may overlap the non-light emitting area NPXA. The mesh lines MSL1 and MSL2 may define mesh openings MSL-OP. Each of the mesh lines may have a line width of several µm to several nm. The mesh openings MSL-OP may one-to-one correspond to the light emitting areas PXA-R, PXA-G, and PXA-B.

The input sensing panel ISP according to an embodiment may include sensing insulation layers TIL1 and TIL2 and conductive layers TML1 and TML2.

A first sensing insulation layer TIL1 may be disposed directly on the thin-film encapsulation layer ECL. A first conductive layer TML1 may be disposed on the first sensing insulation layer TILL A second sensing insulation layer TIL2 may be disposed on the first sensing insulation layer TIL1 to cover the first conductive layer TML1. A second conductive layer TML2 may be disposed on the second sensing insulation layer TIL2.

The conductive layers TML1 and TML2 according to an embodiment may include at least one of metal and a transparent conductive material, which each may have a single-layer structure. For example, the metal may include molybdenum, silver, titanium, copper, aluminum, and an alloy thereof.

The transparent conductive material may include transparent conductive oxide such as indium tin oxide (ITO), indium zinc oxide (IZO), zinc oxide (ZnO), or indium tin zinc oxide (ITZO). The transparent conductive material may include a conductive polymer such as PEDOT, a metal nano-wire, graphene, or a combination thereof.

The conductive layers TML1 and TML2 may include metal layers having a multi-layer structure. The multi-layered metal layers may have, e.g., a three-layer structure of titanium/aluminum/titanium. The multi-layered conductive layers TML1 and TML2 may include at least one metal layer and at least one transparent conductive layer.

In an embodiment, the first conductive layer TML1 may include the first bridge patterns BP1 described in FIGS. 5 and 6. The second conductive layer TML2 may include the first sensing patterns SP1, the second sensing patterns SP2, and the second bridge patterns BP2 described in FIGS. 5 and 6.

Each of the sensing lines TL1, TL2, and TL3 may have a multi-layer structure including the first conductive layer TML1 and the second conductive layer TML2, which may be connected through a contact hole defined in the second sensing insulation layer TIL2, or a single-layer structure including only one layer of the first conductive layer TML1 and the second conductive layer TML2. However, embodiments are not limited thereto.

In other embodiments, the first sensing insulation layer TIL1 may be omitted, or the first conductive layer TML1 may be disposed directly on the thin-film encapsulation layer ECL, and may not be limited to any one embodiment.

Referring to FIG. 7A, the display module DM according to an embodiment may include an optical functional layer PFL. The optical functional layer PFL may cover the input sensing panel ISP. The optical functional layer PFL may include an organic insulation layer OFL and a cover layer HRF. The organic insulation layer OFL may be disposed on the input sensing panel ISP, and the cover layer HRF may be disposed on the organic insulation layer OFL.

According to an embodiment, the organic insulation layer OFL may be disposed on the second sensing insulation layer TIL2 to cover the second conductive layer TML2.

The organic insulation layer OFL may include a second opening OP-S. The second opening OP-S may be defined as a side surface OFL-S of a passing-through portion of the organic insulation layer OFL.

The second sensing insulation layer TIL2 overlapping the second opening OP-S in the second sensing insulation layer TIL2 may be exposed from the organic insulation layer OFL by the second opening OP-S.

In an embodiment, the second opening OP-S defined in the organic insulation layer OFL may overlap the first opening OP-D defined in the pixel defining layer PDL. As the second opening OP-S may overlap the first opening OP-D, a loss generated as light provided from the light emitting layer EL passes through the organic insulation layer OFL may be prevented.

The organic insulation layer OFL may have a refractive index in a range from about 1.3 to about 1.6. The organic insulation layer OFL may include a base layer and a low refractive material contained in the base layer. For example, the base layer may include at least one of acrylic-based material, epoxy-based material, siloxane-based material, imide-based material, and a compound thereof. The base layer may include the same material as the organic layer of the thin-film encapsulation layer ECL and may include a photocurable material.

The low refractive material may include at least one of (ethyl)hexyl acrylate, pentafluoropropyl acrylate, poly(ethylene glycol) dimethacrylate, and ethylene glycol dimethacrylate.

The cover layer HRF may be disposed on the organic insulation layer OFL. The cover layer HRF may be disposed on the organic insulation layer OFL to provide a flat surface and cover the side surface OFL-S of the organic insulation layer OFL defining the second opening OP-S.

The cover layer HRF according to an embodiment may have a relatively greater refractive index than the organic insulation layer OFL. For example, the cover layer HRF may have a refractive index in a range from about 1.65 to about 1.85.

The cover layer HRF may include a base layer containing a polymer material and a high refractive material included in the base layer. The base layer may include at least one of acrylic-based, epoxy-based, siloxane-based, imide-based, and a compound thereof, e.g., polydiarylsiloxane, methyltrimethoxysilane, or tetramethoxysilane.

The high refractive index may include at least one of zirconium oxide ($ZrO_2$), titanium oxide ($TiO_2$), silicone oxide ($SiO_2$), zinc oxide ($ZnO_2$), and a mixture thereof. The high refractive material may have a diameter equal to or less than about 100 nm. In an embodiment, the side surface OFL-S of the organic insulation layer OFL defining the second opening OP-S may be inclined by a predetermined angle from the second sensing insulation layer TIL2.

An inclined angle θ of the side surface OFL-S of the organic insulation layer OFL from the second sensing insulation layer TIL2 may be equal to or greater than about 45° and equal to or less than about 89°.

When the inclined angle θ of the side surface OFL-S of the organic insulation layer OFL from the second sensing insulation layer TIL2 may be less than about 45°, light incident to the side surface OFL-S may be substantially distinct to the non-light emitting area NPXA instead of being provided to the light emitting area PXA-S. In case that an inclined angle θ of the side surface OFL-S of the organic insulation layer OFL from the second sensing insulation layer TIL2 exceeds about 89°, since the angle between the second sensing insulation layer TIL2 and the side surface OFL-S approaches a right angle, total-reflection may not be performed.

According to an embodiment, a portion of the light provided from the light emitting layer EL may be viewed to the user through the cover layer HRF, the side surface OFL-S of the organic insulation layer OFL, and the cover layer HRF. According to an embodiment, the cover layer HRF may have a relatively greater refractive index than the organic insulation layer OFL, and as the side surface OFL-S of the organic insulation layer OFL defining the second opening OP-S may be inclined by a predetermined angle from the second sensing insulation layer TIL2, the light FL incident to the side surface OFL-S of the organic insulation layer OFL may be totally reflected and viewed to the user instead of being distinct.

According to an embodiment, as the light FL incident to the side surface OFL-S of the organic insulation layer OFL may be totally reflected and viewed to the user instead of being distinct among the light provided from the light emitting layer EL, the light emitting area PXA-S that may be substantially viewed to the user may be greater than the light emitting area PXA defined by an area of the first opening OP-D of the pixel defining layer PDL. Thus, the display apparatus EA having an improved light emitting efficiency may be provided.

Referring to FIG. 7B, a display module DM-1 according to an embodiment described in FIGS. 5 and 6 unlike FIG. 7A may include a display panel DP, an input sensing panel ISP-A, an organic insulation layer OFL, and a cover layer HRF.

The display panel DP, the organic insulation layer OFL, and the cover layer HRF of the display module DM-1 may be the same as the display panel DP, the organic insulation layer OFL, and the cover layer HRF described in FIG. 7A, and repetitive description will be omitted.

In an embodiment, an input sensing panel ISP-1 may include a sensing insulation layer TIL1-1 and a conductive layer TML1-1.

The sensing insulation layer TIL1-1 may be disposed directly on a thin-film encapsulation layer ECL. The conductive layer TML1-1 may be disposed on the sensing insulation layer TIL1-1 and covered by the organic insulation layer OFL.

The organic insulation layer OFL may include a second opening OP-S. The second opening OP-S may be defined as a side surface OFL-S of a passing-through portion of the organic insulation layer OFL. The second opening OP-S may overlap a first opening OP-D defined in the pixel defining layer PDL. As the second opening OP-S may overlap the first opening OP-D, a loss generated as light provided from a light emitting layer EL passes through the organic insulation layer OFL may be prevented.

The conductive layer TML1-1 according to an embodiment may include first sensing patterns SP1, first bridge patterns BP1, second sensing patterns SP2, second bridge patterns BP2, and sensing lines TL1, TL2, and TL3 described in FIGS. 5 and 6. Thus, an input sensing panel ISP-1 according to the embodiment may be provided as one layer unlike the input sensing panel ISP of FIG. 7A.

Figure 8:
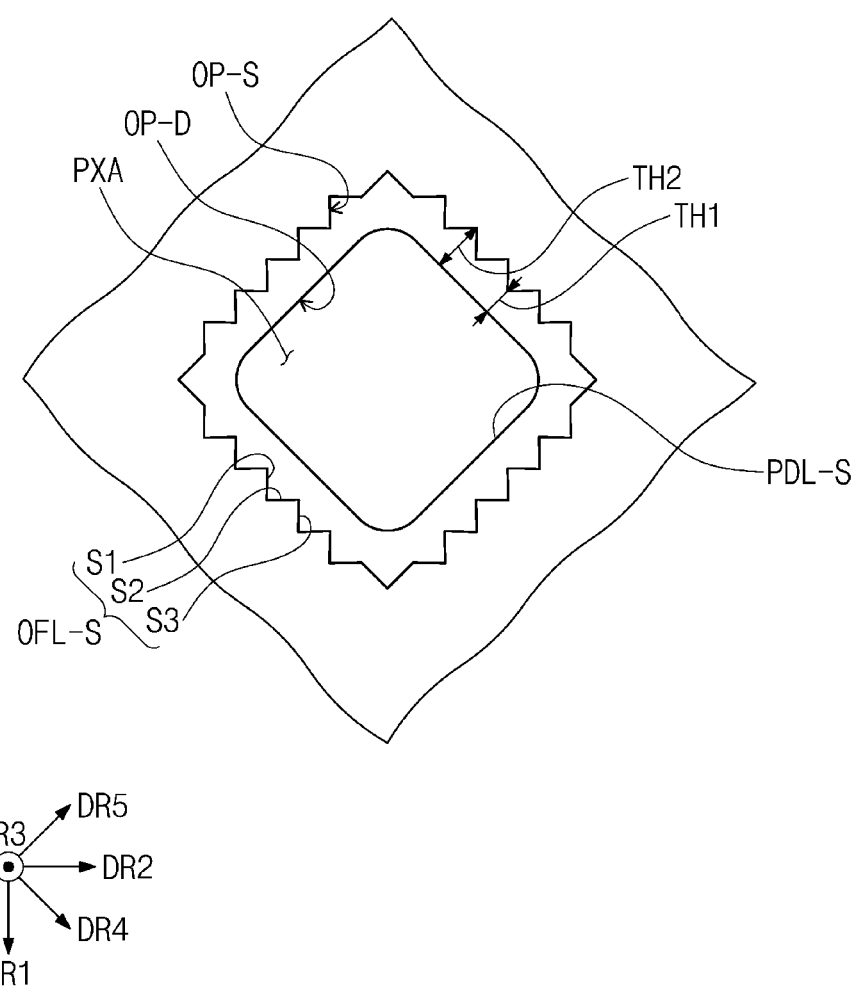
FIG. 8 is a schematic plan view illustrating a relationship between a sensing insulation layer and a light emitting area according to an embodiment.
Figure 9:
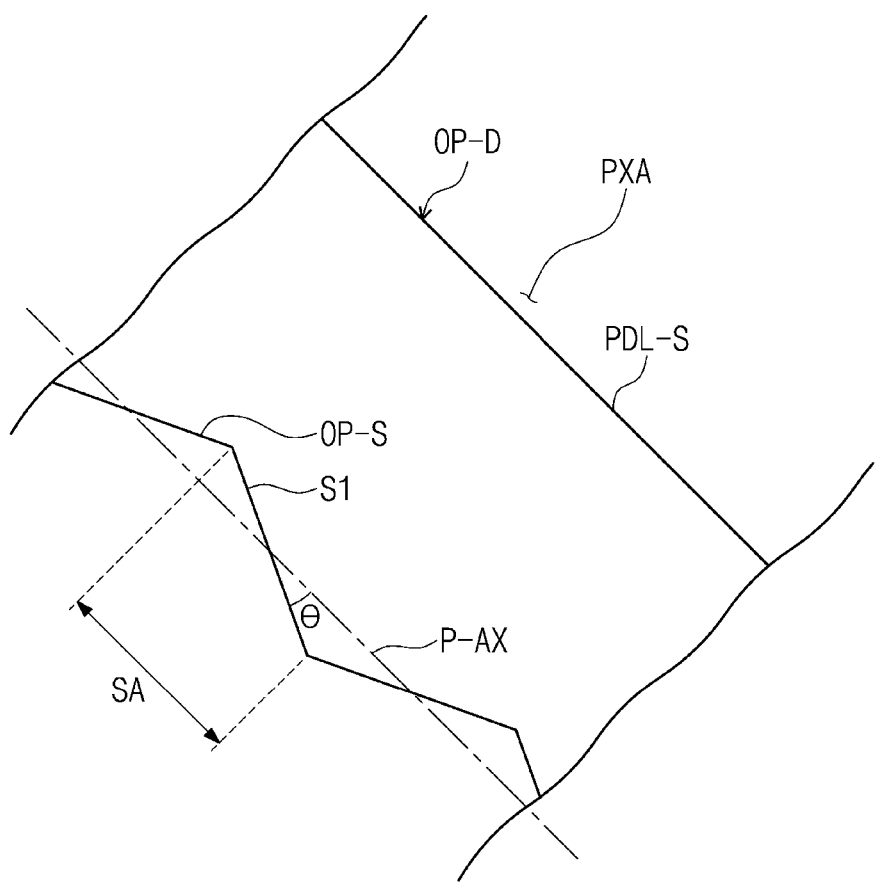
FIG. 9 is a schematic plan view illustrating a relationship between a side surface of a pixel defining layer and a side surface of a sensing insulation layer according to an embodiment.

FIG. 8 is a schematic plan view illustrating a relationship between the sensing insulation layer and the light emitting area according to an embodiment. FIG. 9 is a schematic plan view illustrating a relationship between a side surface of the pixel defining layer and a side surface of the sensing insulation layer according to an embodiment. Repetitive description of the same or similar components as those described in FIGS. 1 to 7A will be omitted.

Referring to FIG. 8, the first opening OP-D may be defined by the side surface PDL-S of the pixel defining layer PDL (refer to FIG. 7A), and the second opening OP-S may be defined by the side surface OFL-S of the organic insulation layer OFL According to an embodiment, the second opening OP-S may surround the first opening OP-D, and the second opening OP-S may have an area greater than that of the first opening OP-D.

The light emitting area PXA defined by the area of the first opening OP-D may correspond to one of the light emitting areas PXA-R, PXA-G, and PXA-B described in FIG. 4C.

In an embodiment, the side surface OFL-S of the organic insulation layer OFL defining the second opening OP-S may include a first protruding side surface S1, a second protruding side surface S2, and a third protruding side surface S3. The first to third protruding side surfaces S1, S2, and S3 may be sequentially and alternately connected and inclined in different directions from the side surface PDL-S of the pixel defining layer PDL.

The first to third protruding side surfaces S1, S2, and S3 according to an embodiment may be connected to have a predetermined pattern shape. For example, the first protruding side surface S1 and the second protruding side surface S2 may be connected (e.g., coupled) in a direction away from the side surface PDL-S of the pixel defining layer PDL, and the second protruding side surface S2 and the third protruding side surface S3 may be connected (e.g., coupled) in a direction toward the side surface PDL-S of the pixel defining layer PDL. Thus, the coupling of the first protruding side surface S1 and the second protruding side surface S2 may increase an area of the second opening OP-S, and the coupling of the second protruding side surface S2 and the third protruding side surface S3 may decrease an area of the second opening OP-S.

According to an embodiment, a minimum distance TH1 from the side surface PDL-S of the pixel defining layer PDL to the side surface OFL-S of the organic insulation layer OFL may be about 0.5 µm. A maximum distance TH2 from the side surface PDL-S of the pixel defining layer PDL to the side surface OFL-S of the organic insulation layer OFL may be about 3.0 µm. In case that a distance from the side surface PDL-S of the pixel defining layer PDL to the side surface OFL-S of the organic insulation layer OFL may be less than the minimum distance TH1 or greater than the maximum distance TH2, a condition for total reflection of light provided to the side surface PDL-S of the pixel defining layer PDL may not be satisfied.

According to an embodiment, each of the first to third protruding side surfaces S1, S2, and S3 may be inclined by a predetermined angle based on a cross point with a virtual line P-AX extending in the same direction as the side surface PDL-S of the pixel defining layer PDL. For example, an inclined angle θ of the first protruding side surface S1 from the virtual line P-AX at a cross point between the first protruding side surface S1 and the virtual line P-AX may be in a range from about 20° to about 45°. In case that the inclined angle θ is about 20°, a width SA of the first protruding side surface S1 may be about 5.5 µm, and in case that the inclined angle θ is about 45°, the width SA of the first protruding side surface S1 may be about 2.0 µm. Here, the width SA may include a process error (+−0.5 µm).

As the first to third protruding side surfaces S1, S2, and S3 may be connected to have a predetermined pattern shape, the side surface OFL-S of the organic insulation layer OFL according to an embodiment may increase an area for total reflection of light provided to the side surface OFL-S of the organic insulation layer OFL more than in case that the side surface of the organic insulation layer OFL has a shape corresponding to the side surface PDL-S of the pixel defining layer PDL. Thus, the display apparatus EA having an improved light emitting efficiency may be provided.

Figure 10:
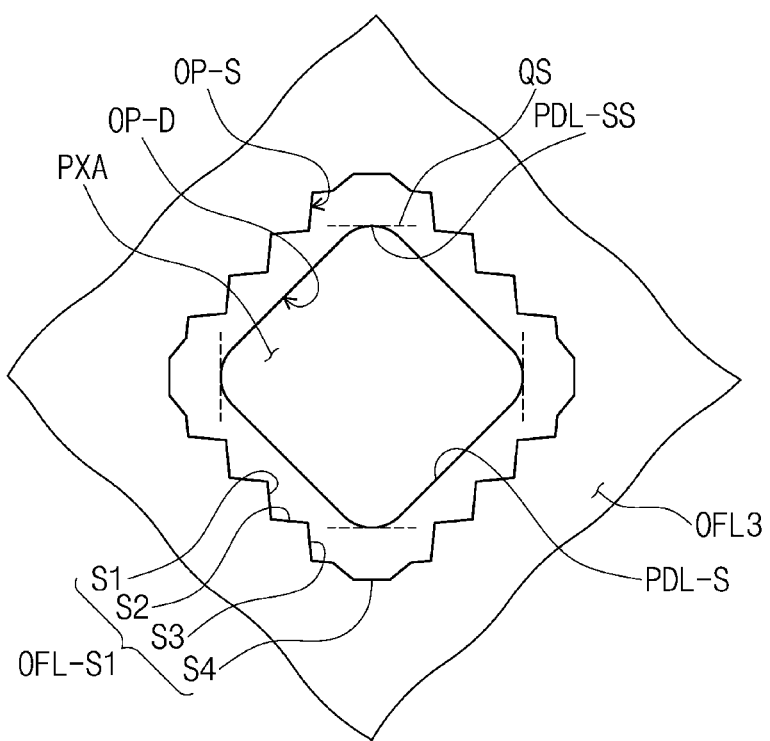
FIG. 10 is a schematic plan view illustrating a relationship between a sensing insulation layer and a light emitting area according to an embodiment.
Figure 10:
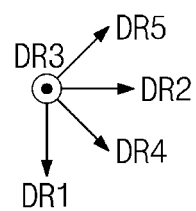

FIG. 10 is a schematic plan view illustrating a relationship between the sensing insulation layer and the light emitting area according to an embodiment. Repetitive description of the same or similar components as those described in FIGS. 1 to 9 will be omitted.

Referring to FIG. 10, the first opening OP-D may be defined by the side surface PDL-S of the pixel defining layer PDL (refer to FIG. 7A), and the second opening OP-S may be defined by a side surface OFL-S1 of the organic insulation layer OFL. According to an embodiment, the second opening OP-S may surround the first opening OP-D, and the second opening OP-S may have an area greater than that of the first opening OP-D.

The light emitting area PXA defined by the area of the first opening OP-D may correspond to one of the light emitting areas PXA-R, PXA-G, and PXA-B described in FIG. 4C.

In an embodiment, the side surface OFL-S1 of the organic insulation layer OFL defining the second opening OP-S may include a first protruding side surface S1, a second protruding side surface S2, a third protruding side surface S3, and a fourth protruding side surface S4. The first to fourth protruding side surfaces S1, S2, S3, and S4 may be sequentially and alternately connected and inclined in different directions from the side surface PDL-S of the pixel defining layer PDL.

The first to fourth protruding side surfaces S1, S2, S3, and S4 according to an embodiment may be connected to have a predetermined pattern shape. For example, the first protruding side surface S1 and the second protruding side surface S2 may be connected (e.g., coupled) in a direction away from the side surface PDL-S of the pixel defining layer PDL, and the second protruding side surface S2 and the third protruding side surface S3 may be connected (e.g., coupled) in a direction toward the side surface PDL-S of the pixel defining layer PDL.

In an embodiment, the fourth protruding side surface S4 may face a corner PDL-SS of the side surface PDL-S of the pixel defining layer PDL defining the first opening OP-D. The fourth protruding side surface S4 may extend in the same direction as a normal line QS of the corner PDL-SS.

Figure 11:
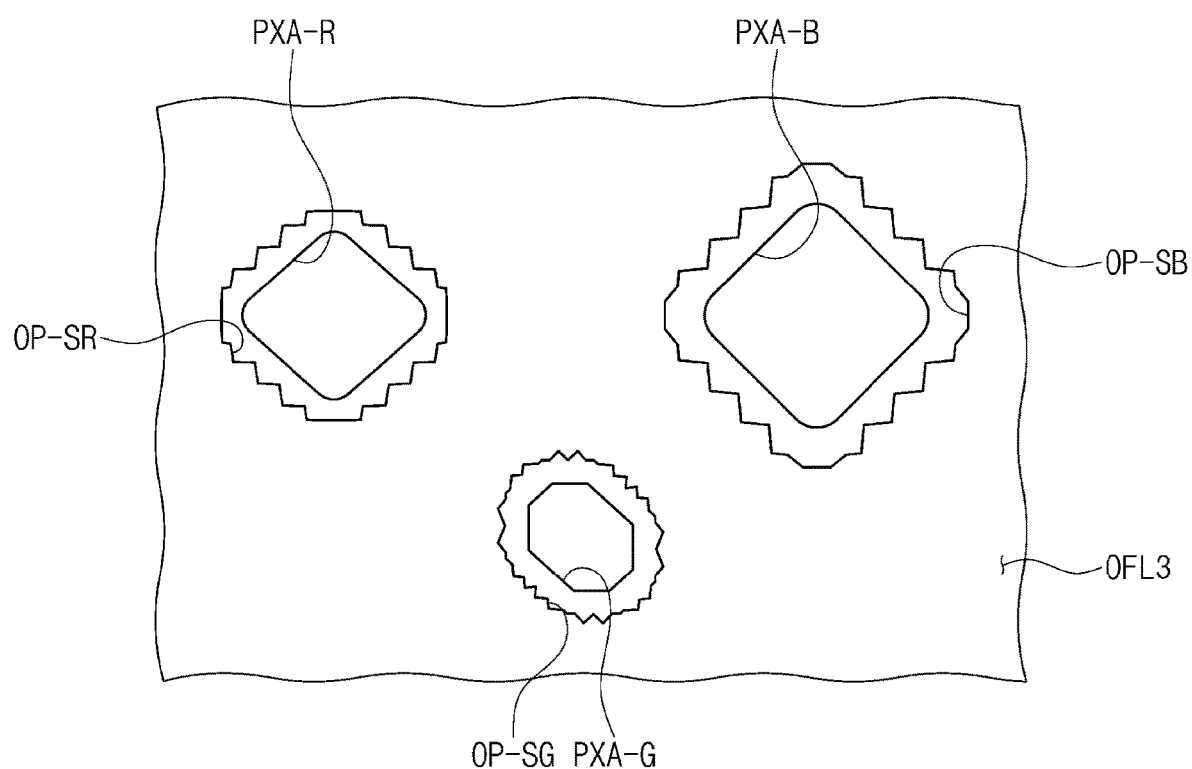
FIG. 11 is a schematic plan view illustrating a relationship between a sensing insulation layer and a light emitting area according to an embodiment.

FIG. 11 is a schematic plan view illustrating a relationship between the sensing insulation layer and the light emitting area according to an embodiment. Repetitive description of the same or similar components as those described in FIGS. 1 to 9 will be omitted.

FIG. 11 illustrates three light emitting areas PXA-R, PXA-G, and PXA-B among the light emitting areas in FIG. 4C and second openings OP-SR, OP-SG, and OP-SB corresponding thereto.

According to an embodiment, the light emitting areas PXA-R, PXA-G, and PXA-B may include different light emitting areas to provide light having different colors. The third light emitting area PXA-B may have a largest area, and the second light emitting area PXA-G may have a smallest area.

In an embodiment, the first light emitting area PXA-R may overlap a first of the second openings OP-SR, the second light emitting area PXA-G may overlap a second of the second openings OP-SG, and the third light emitting area PXA-B may overlap a third of the second openings OP-SB.

The second openings OP-SR, OP-SG, and OP-SB overlapping the light emitting areas PXA-R, PXA-G, and PXA-B, respectively, may be defined by side surfaces OFL-S of through-portions of the organic insulation layer OFL (refer to FIG. 7A).

The number of protruding side surfaces included in the side surface OFL-S of the organic insulation layer OFL defining the second openings OP-SR, OP-SG, and OP-SB, respectively, may be varied. For example, the number of the protruding side surfaces of the organic insulation layer OFL defining the first of the second openings OP-SR may be greater than that of the protruding side surfaces of the organic insulation layer OFL defining the second of the second openings OP-SG. The number of the protruding side surfaces of the organic insulation layer OFL defining the third of the second openings OP-SB may be greater than that of the protruding side surfaces of the organic insulation layer OFL defining the second of the second openings OP-SR.

Figure 12:
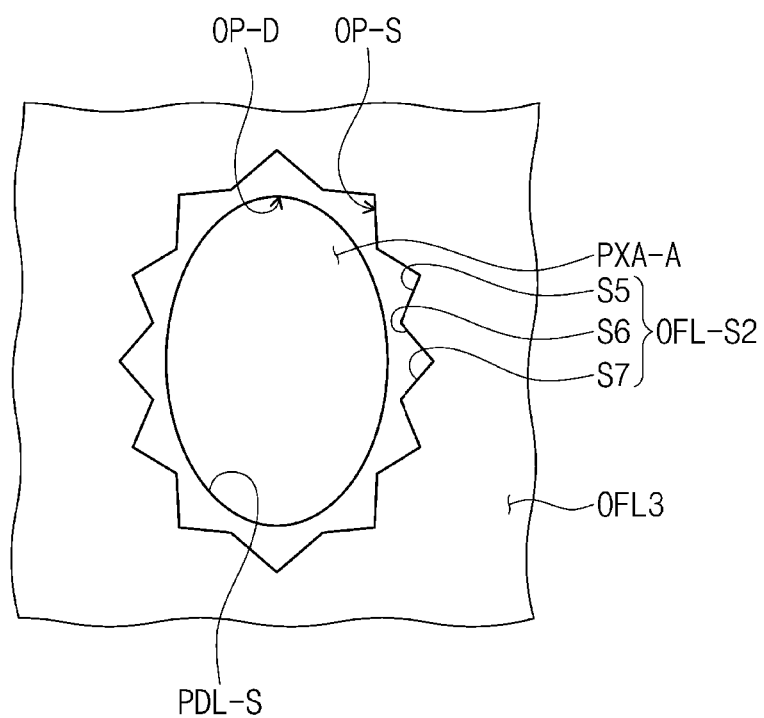
FIG. 12 is a schematic plan view illustrating a relationship between a sensing insulation layer and a light emitting area according to an embodiment.
Figure 12:
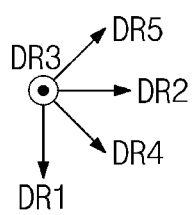
Figure 13:
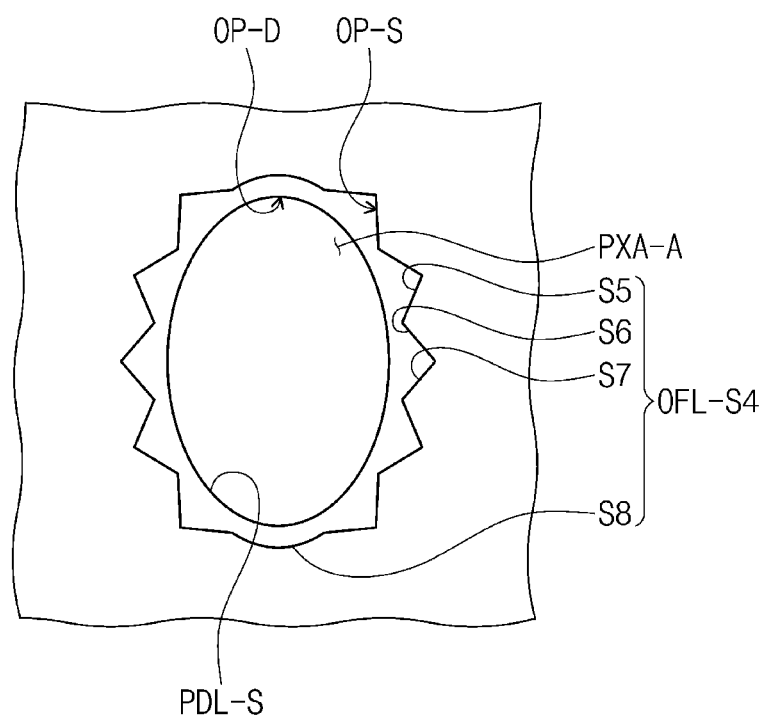
FIG. 13 is a schematic plan view illustrating a relationship between a sensing insulation layer and a light emitting area according to an embodiment.
Figure 13:
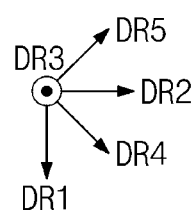

FIG. 12 is a schematic plan view illustrating a relationship between the sensing insulation layer and the light emitting area according to an embodiment. FIG. 13 is a schematic plan view illustrating a relationship between the sensing insulation layer and the light emitting area according to an embodiment. Repetitive description of the same or similar components as those described in FIGS. 1 to 9 will be omitted.

Referring to FIG. 12, the first opening OP-D according to an embodiment may have an oval shape. Thus, the side surface PDL-S of the pixel defining layer PDL defining the first opening OP-D may be a curved surface. Thus, the light emitting area PXA-A may have also an oval shape. However, embodiments are not limited thereto. For example, the light emitting area PXA-A may have a circular shape.

In an embodiment, a side surface OFL-S2 of the organic insulation layer OFL defining the second opening OP-S may include a fifth protruding side surface S5, a sixth protruding side surface S6, and a seventh protruding side surface S7. The fifth to seventh protruding side surfaces S5, S6, and S7 may be sequentially and alternately connected and inclined in different directions from the side surface PDL-S of the pixel defining layer PDL.

The fifth to seventh protruding side surfaces S5, S6, and S7 according to an embodiment may be connected to have a predetermined pattern shape. For example, the fifth protruding side surface S5 and the sixth protruding side surface S6 may be connected (e.g., coupled) in a direction toward the side surface PDL-S of the pixel defining layer PDL, and the sixth protruding side surface S6 and the seventh protruding side surface S7 may be connected (e.g., coupled) in a direction away from the side surface PDL-S of the pixel defining layer PDL.

Referring to FIG. 13, the first opening OP-D according to an embodiment may have an oval shape. Thus, the side surface PDL-S of the pixel defining layer PDL defining the first opening OP-D may be a curved surface. Thus, the light emitting area PXA-A may have also an oval shape.

In an embodiment, a side surface OFL-S4 of the organic insulation layer OFL defining the second opening OP-S may include a fifth protruding side surface S5, a sixth protruding side surface S6, a seventh protruding side surface S7, and an eighth protruding side surface S8. The fifth to seventh protruding side surfaces S5, S6, and S7 may be sequentially and alternately connected and inclined in different directions from the side surface PDL-S of the pixel defining layer PDL. The fifth to seventh protruding side surfaces S5, S6, and S7 may correspond to the fifth to seventh protruding side surfaces S5, S6, and S7 described in FIG. 12, respectively.

According to an embodiment, the eighth protruding side surface S8 may include a curved surface. In an embodiment, the eighth protruding side surface S8 may face an area having a maximum curvature among the side surface PDL-S of the pixel defining layer PDL.

According to an embodiment, as the light incident to a side surface of a sensing insulation layer among the light provided from the light emitting layer may be totally reflected and viewed by a user instead of being distinct, a light emitting area that may be substantially viewed by the user may increase more than a light emitting area defined by the area of the opening of a pixel defining layer. Thus, a display apparatus having improved light emitting efficiency may be provided.

Although embodiments have been described, it is understood that the disclosure should not be limited to these embodiments but various changes and modifications can be made by one ordinarily skilled in the art within the spirit and scope of the disclosure as hereinafter claimed.

Hence, the real protective scope of the disclosure shall be determined by the technical scope of the accompanying claims including equivalents thereof.

What is claimed is:

1. A display apparatus comprising:
    a display panel comprising:
        a first electrode;
        a pixel defining layer comprising a first opening that exposes at least a portion of the first electrode;
        a light emitting layer disposed on the first electrode;
        a display device layer comprising a second electrode disposed on the light emitting layer; and
        a thin-film encapsulation layer that overlaps the display device layer;
    an input sensing panel disposed on the thin-film encapsulation layer and comprising a sensing insulation layer and a conductive layer; and
    an organic insulation layer that overlaps the sensing insulation layer and comprises a second opening overlapping the first opening, wherein
    a side surface of the organic insulation layer defines the second opening and comprises protruding side surfaces inclined in different directions as compared to a side surface of the pixel defining layer in plan view, and
    the side surface of the pixel defining layer defines the first opening.

2. The display apparatus of claim 1, wherein
    an inclined angle of each of the protruding side surfaces at cross points with a virtual line is in a range from about 20° to about 45°, and
    the virtual line extends in a same direction as an extension direction of the side surface of the pixel defining layer.

3. The display apparatus of claim 2, wherein
    the protruding side surfaces comprises a first protruding side surface, a second protruding side surface, and a third protruding side surface that are sequentially connected,
    the first protruding side surface and the second protruding side surface are connected in direction away from the side surface of the pixel defining layer,
    the second protruding side surface and the third protruding side surface are connected in direction toward the side surface of the pixel defining layer, and
    inclined angles of the first protruding side surface and the third protruding side surface at cross points with the virtual line are equal to each other.

4. The display apparatus of claim 1, wherein a corner of the side surface of the organic insulation layer extends in a same direction as a normal line of a corner of the side surface of the pixel defining layer.

5. The display apparatus of claim 1, wherein in the side surface of the pixel defining layer, a distance to the side surface of the organic insulation layer defining the second opening is in a range from about 0.5 μm to about 3 μm.

6. The display apparatus of claim 1, wherein an inclined angle of each of the protruding side surfaces from the sensing insulation layer is in a range from about 45° to about 89°.

7. The display apparatus of claim 1, further comprising a cover layer disposed on the organic insulation layer overlapping the side surface of the organic insulation layer defining the second opening,
    wherein the cover layer has a refractive index greater than a refractive index of the organic insulation layer.

8. The display apparatus of claim 7, wherein the cover layer overlapping the second opening contacts the sensing insulation layer.

9. The display apparatus of claim 8, wherein the cover layer comprises:
    a base layer comprising a polymer material; and
    a high refractive material comprising at least one of zirconium oxide ($ZrO_2$), titanium oxide ($TiO_2$), silicone oxide ($SiO_2$), and zinc oxide ($ZnO_2$), which are included in the base layer.

10. The display apparatus of claim 1, wherein the organic insulation layer comprises:
    a base layer comprising a polymer material; and
    a low refractive material comprising at least one of (ethyl)hexyl acrylate, pentafluoropropyl acrylate, poly (ethylene glycol) dimethacrylate, and ethylene glycol dimethacrylate, which are included in the base layer.

11. The display apparatus of claim 10, wherein
    the first opening includes a plurality of sub openings having different areas, and
    a number of the protruding side surfaces surrounding one of the plurality of sub openings is different from a number of the protruding side surfaces surrounding another one of the plurality of sub openings.

12. The display apparatus of claim 1, wherein the first opening has at least one of a circular shape and an oval shape in plan view.

13. The display apparatus of claim 12, wherein at least one of the protruding side surfaces comprises a curved surface.

14. The display apparatus of claim 1, wherein the second opening has an area greater than an area of the first opening.

15. A display apparatus comprising:
    a display panel comprising:
        a first electrode;
        a pixel defining layer comprising a first opening that exposes at least a portion of the first electrode;
        a light emitting layer disposed on the first electrode;
        a display device layer comprising a second electrode disposed on the light emitting layer; and
        a thin-film encapsulation layer that overlaps the display device layer;
    an input sensing panel disposed on the thin-film encapsulation layer and comprising a sensing insulation layer and a conductive layer; and
    an organic insulation layer that overlaps the sensing insulation layer and comprises a second opening overlapping the first opening, wherein a side surface of the organic insulation layer defines the second opening and comprises a first protruding side surface, a second protruding side surface, and a third protruding side surface that are inclined in at least two different directions in plan view, the first protruding side surface and the second protruding side surface are connected in a direction away from a side surface of the pixel defining layer, which defines the first opening, and the second protruding side surface and the third protruding side surface are connected in a direction toward the side surface of the pixel defining layer.

16. The display apparatus of claim 15, wherein
an inclined angle of each of the protruding side surfaces at cross points with a virtual line is in a range from about 20° to about 45°, and
the virtual line extends in a same direction as an extension direction of the side surface of the pixel defining layer.

17. The display apparatus of claim 16, wherein inclined angles of the first and third protruding side surfaces at cross points with the virtual line are equal to each other.

18. The display apparatus of claim 15, wherein a corner of the side surface of the organic insulation layer extends in a same direction as a normal line of a corner of the side surface of the pixel defining layer.

19. The display apparatus of claim 15, wherein in the side surface of the pixel defining layer, a distance to the side surface of the organic insulation layer defining the second opening is in a range from about 0.5 µm to about 3 µm.

20. The display apparatus of claim 15, further comprising a cover layer disposed on the organic insulation layer overlapping the side surface of the organic insulation layer defining the second opening,
wherein the cover layer has a refractive index greater than a refractive index of the organic insulation layer.

* * * * *